United States Patent [19]
Song

[11] Patent Number: 5,838,951
[45] Date of Patent: Nov. 17, 1998

[54] WAFER MAP CONVERSION METHOD

[75] Inventor: Chee Jung Song, Kangdong-ku, Rep. of Korea

[73] Assignees: ANAM Industrial Co., Ltd, Seoul, Rep. of Korea; AMKOR Electronics, Inc., Chandler, Ariz.

[21] Appl. No.: 704,477

[22] Filed: Aug. 28, 1996

[30] Foreign Application Priority Data

Feb. 29, 1996 [KR] Rep. of Korea ..................... 96-5343

[51] Int. Cl.⁶ .................................................. G06F 11/00
[52] U.S. Cl. ........................ 395/500; 364/490; 324/754
[58] Field of Search .................................. 364/488, 489, 364/490, 491, 578; 371/22.1, 22.2, 29.1; 324/754

[56] References Cited

U.S. PATENT DOCUMENTS

| | | | |
|---|---|---|---|
| 4,915,565 | 4/1990 | Bond et al. | 414/225 |
| 5,172,053 | 12/1992 | Itoyama | 324/158 |
| 5,360,747 | 11/1994 | Larson et al. | 437/8 |
| 5,390,131 | 2/1995 | Rohrbaugh et al. | 364/490 |
| 5,511,005 | 4/1996 | Abbe et al. | 364/552 |
| 5,532,499 | 7/1996 | Cheng | 250/559.22 |
| 5,585,737 | 12/1996 | Shibata | 324/754 |

Primary Examiner—Kevin J. Teska
Assistant Examiner—A. S. Roberts
Attorney, Agent, or Firm—Skjerven, Morrill, MacPherson, Franklin & Friel LLP

[57] ABSTRACT

A wafer map conversion method capable of converting a format file, which includes data about a wafer obtained by category grades through a wafer testing device and all information associated with the wafer in accordance with a certain format, into a configuration file or standard file which can be practically applied to a die bonding device, thereby easily checking the content of the process through a processing mode translated from the configuration file or standard file. Practically, the die bonding process for good-grade dies by grade levels can be achieved based on BCE data. It is also possible to perform the die bonding process in accordance with a certain map format without requiring any test for the wafer memory and dies. Only selected dies can be processed without requiring an alignment and test for every die. Accordingly, a great improvement in the process quality is obtained. An improvement in yield in processing rate (UPH) is also achieved. The efficiency of the equipment used for the die bonding process is also enhanced. In addition, it is unnecessary to perform the ink dotting process after the probe test. As a result, the manufacturing cost is greatly reduced.

13 Claims, 12 Drawing Sheets

```
FILE:M00002U8M01₩ID:1                    ₩LOT:A12345     ₩TYPE:50305STR
₩PASS:1₩MAPM:0₩PAM:0₩ROT:90₩COL:32₩ROW:26₩REF:15,5₩RDC:15,5₩WSIZ:100₩
UNIT:1₩XSIZ:3810₩YSIZ:4570₩TDIE:345₩XPOL:1₩YPOL:1₩BCE:0,1;1,0;2,0;3,0;
4,0;5,0;6,0;7,0;8,0;9,0;10,0;11,0;12,0;13,0;14,0;15,0;16,0;17,0;18,0;
19,0;20,0;21,0;22,0;23,0;24,0;25,0;26,0;27,0;28,0;29,0;30,0;31,0₩
@!        ""     ""  !!@@ !      "          "             ! ! @
@ !    !@!@!!    !!  !!@
@!!!!   !  ! !@@!  ""   ! !     "      !!@
@!"   !!   !!!  "   "     !@@@!!    !   ""      !!@⊥
⊦@!!!!!  !  "    !!@⊤⊦@!!       ""     !!@@⊦⊤
@@!!  !  ""  !@@
⊦
@@@@@@@@
```

FIG. 1

```
FNAME: M00002U8M01
WF_ID: 1
WFLOT: A12345
WFTYP: 50305STR
PASS: 1, MAPM: 0
PAM: 0,  ROT: 90
ROW: 26,  COL: 32
REF: (15,5) RDC: (15,5)
WFDIA: 100 mm UNITES: 1
X_SZ: 3810 Y_SZ: 4570
TDIE: 345  XPOL: 1  YPOL: 1
```

```
MapA[ 0]:  ....................
MapA[ 1]:  ........@@@@@@@.........
MapA[ 2]:  .....@@!!!!!!!!!@......
MapA[ 3]:  ...@@!!!!!!!!!!!!!@@....
MapA[ 4]:  ..@@!!!!!!!!!!!!!!@...
MapA[ 5]:  .@!!!               !@..
MapA[ 6]:  .@!     """""        !!!@.
MapA[ 7]:  @!!!           """"       !@
MapA[ 8]:  @!!!           """   "    !!@
MapA[ 9]:  @!         "           "" !!@
MapA[10]:  @!    "       "         !!@
MapA[11]:  @  !      "       !@
MapA[12]:  @ !!      "       !!    !!@
MapA[13]:  @   !! !     ! "   ! " !    !@
MapA[14]:  @!   ""     ! !      "     !!@
MapA[15]:  @! "    !!      !!!  "   "    !@
MapA[16]:  @@!!       !     ""       !!@.
MapA[17]:  .@!!!!!    !    "    !!@..
MapA[18]:  .@!!          ""        !!@@..
MapA[19]:  ..@!                  !!@....
MapA[20]:  ...@@!!   !   ""  !@@.....
MapA[21]:  ....@@@@@@@......
MapA[22]:  ................
```

FIG. 3

```
01^^^^^^^^^^3675074000743675010^^^^^^^^^^^950204^16^14^^5^13
^7400^7400ICC^^^1^^^301114R^^^^^2^^1041114R^^^^^3^^^^0^^^^^^
^^^^4^^^^0^^^^^^^^^^5^^^^0^^^^^^^^^^^^^^^^^^^^^^^^^^^^^^^^^^^
^^^^^^^^^^^^^^^^^^^^^^^^^^^^^^^^^^^^^^^^^^^^^^^^^^^^^^^^^^^^^
^^^^....1111111Bu.......111C11111....u1C1C1112222Bu..C222C22
1222222.u222B221222C222uB22B2BB221C2222C22B22CB21222222CC22C
22B222212222.C22C122C222222C.22222CCC222122u.BC22122C222222.
.u22BCC2C22122u....A2CB2C2C22......uCB22B221u...
```

FIG. 4

```
Wf Map Revision Numb: 01
Container            :
Lot Number           : 3675074000
Wafer Number         : 743675010
Magnet Or Frame Numb:
Date Of Probing      : 950204
Size Of X Dim Of Map: 16
Size Of Y Dim Of Map: 14
X Cordin Of Alignmen:  5
Y Cordin Of Alignmen: 13
Step&Repeat Of X Dim: 7400
Step&Repeat Of Y Dim: 7400
Status               : ICC
ASCIIChar 1stSortCat: 1
Numb1stCat(GoodNumb):    30
Code ID Of 1st Categ: 1114R
Char, Count&Code#2#5: 2   1041114R      3  0          4  0          5  0
Miscellaneous Inform:

MapA[ 0]: ....1111111Bu...
MapA[ 1]: ....111C11111...
MapA[ 2]: .u1C1C1112222Bu.
MapA[ 3]: .C222C221222222.
MapA[ 4]: u222B221222C222u
MapA[ 5]: B22B2BB221C2222C
MapA[ 6]: 22B22CB21222222C
MapA[ 7]: C22C22B222212222
MapA[ 8]: .C22C122C222222C
MapA[ 9]: .22222CCC222122u
MapA[10]: .BC22122C222222.
MapA[11]: .u22BCC2C22122u.
MapA[12]: ...A2CB2C2C22...
MapA[13]: ...uCB22B221u...
```

FIG. 6

```
/*===DEFINE.TXT===*/
:1   HM1410BS-7  F88825  :333212
:X   X 1172 020 000  :Y -Y 0521
040 000
:1=-  2=/  3=(  4=*
/*=WAFR01.TXT=*/
 F88825  , 01
 ,014,021:3  ,015,021:(  ,016,021:-
 ,017,022:-  ,016,022:*  ,015,022:-
 ,014,022:-  ,013,022:(  ,012,023:S
 ,013,023:*  ,014,023:(  ,015,023:-
 ,016,023:-  ,017,023:-  ,018,023:-
 ,018,024:3  ,017,024:3  ,016,024:-
 ,015,024:-  ,014,024:-  ,013,024:-
 ,012,024:3  ,011,025:O  ,012,025:(
 ,013,025:-  ,014,025:-  ,015,025:-
 ,016,025:-  ,017,025:-  ,018,025:-
 ,019,025:-  ,019,026:-  ,018,026:9
 ,017,026:-  ,016,026:-  ,015,026:(
 ,014,026:-  ,013,026:-  ,012,026:-
 ,011,026:S  ,011,027:O  ,012,027:3
 ,013,027:-  ,014,027:-  ,015,027:-
 ,016,027:-  ,017,027:-  ,018,027:H
 ,019,027:-  ,020,028:O  ,019,028:-
 ,018,028:-  ,017,028:-  ,016,028:-
 ,015,028:9  ,014,028:(  ,013,028:-
 ,012,028:-  ,011,028:O  ,010,029:-
 ,011,029:-  ,012,029:-  ,013,029:3
 ,014,029:-  ,015,029:-  ,016,029:-
 ,017,029:-  ,018,029:-  ,019,029:*
 ,020,029:-  ,020,030:-  ,019,030:-
 .........   .........   .........
 .........   .........   .........
 ":-,0153  :/,0000  :(,0010  :*,0012
 ",0175
```

FIG. 7

```
PartNm:HM1410BS-7
LotNmb:F88825
TestNm:333212
WfNmb:01   X:X  Y:-Y
AddY->min:21max:46cnt:26
AddX->min:10max:20cnt:11
RefX:020 RefY:040
XDim:1172 YDim:0521
BCE_DT:  -/(*
GoodNmb:0175
-:153 /:   0 (: 10 *: 12

RefX:010 RefY:019
XDim:461 YDim:205 WfDim:5075 Mils

MapA[ 0]:  ....3(-....
MapA[ 1]:  ...(--*-...
MapA[ 2]:  ..S*(----..
MapA[ 3]:  ..3----33..
MapA[ 4]:  .O(-------.
MapA[ 5]:  .S---(--9-.
MapA[ 6]:  .O3-----H-.
MapA[ 7]:  .O--(9----O
MapA[ 8]:  ---3------*-
MapA[ 9]:  -3-3-------
MapA[10]:  OO3-------
MapA[11]:  3OJ3--9-3--
MapA[12]:  -----------
MapA[13]:  3---*(-----
MapA[14]:  J9---------
MapA[15]:  OO(*-------
MapA[16]:  3*------*--
MapA[17]:  3-*---*----
MapA[18]:  .O--3--39-O
MapA[19]:  .O----3(--.
MapA[20]:  .3*3---*--.
MapA[21]:  .H3H-3----.
MapA[22]:  ..3H-3---..
MapA[23]:  ..3-(----..
MapA[24]:  ...3--*-...
MapA[25]:  ....J--....
```

FIG. 9

```
MpRvNmb[2+1]   ; 01
CustmNm[10+1]; HARRIS
WfId[10+1]     ; 17
LtId[10+1]     ; D28224
FrId[11+1]     ; MKLA006XM01
PrbDt[6+1]     ; MMddYY
ArrXSz[2+1]    ; 51
ArrYSz[2+1]    ; 19
DieXsz[3+1]    ; 81
DieYsz[3+1]    ; 201
WfSize[1+1]    ; 5
MpAngl[3+1]    ; 0
RfXCdn[2+1]    ; 25
RfYCdn[2+1]    ; 9
CtgCnt[2+1]    ; 5
Ctgry[MXBIN+1];     "@!
BCE_DT[MX_PK+1];    "
Stts1[22+1]    ; WTyp:50844-9.STD
Stts2[22+1]    ; TDie:595

```
MpRvNmb[2+1]   ; 01
CustmNm[10+1]  ; AT&T
WfId[10+1]     ; 743675010
LtId[10+1]     ; 3675074000
FrId[11+1]     ;
PrbDt[6+1]     ; 950204
ArrXSz[2+1]    ; 16
ArrYSz[2+1]    ; 14
DieXsz[3+1]    ; 291
DieYsz[3+1]    ; 291
WfSize[1+1]    ; 4
MpAngl[3+1]    ; 0
RfXCdn[2+1]    ; 5
RfYCdn[2+1]    ; 1
CtgCnt[2+1]    ; 7
Ctgry[MXBIN+1] ; 12.BuCA
BCE_DT[MX_PK+1]; 12
Stts1[22+1]    ; Stts:ICC    CdId:1114R      GDie:   30
Stts2[22+1]    ; GDie:   30

....1111111Bu...
....111C11111...
.u1C1C1112222Bu.
.C222C221222222.
u222B221222C222u
B22B2BB221C2222C
22B22CB21222222C
C22C22B222212222
.C22C122C222222C
.22222CCC222122u
.BC22122C222222.
.u22BCC2C22122u.
...A2CB2C2C22...
...uCB22B221u...
```

FIG. 11

```
MpRvNmb[2+1]   ; XX
CustmNm[10+1]; HITACHI
WfId[10+1]     ; 01
LtId[10+1]     ; F88825
FrId[11+1]     ; wafr01
PrbDt[6+1]     ; MMddYY
ArrXSz[2+1]    ; 11
ArrYSz[2+1]    ; 26
DieXsz[3+1]    ; 461
DieYsz[3+1]    ; 205
WfSize[1+1]    ; 500
MpAngl[3+1]    ; 0
RfXCdn[2+1]    ; 11
RfYCdn[2+1]    ;  8
CtgCnt[2+1]    ; 10
Ctgry[MXBIN+1]; (-*.3SO9HJ
BCE_DT[MX_PK+1]; (-*
Stts1[22+1]    ; 1HM1410BS-7
Stts2[22+1]    ; TestNm:333212

....3(-....
...(--*-...
..S*(----..
..3----33..
.O(-------.
.S---(--9-.
.O3-----H-.
.O--(9----O
---3------*-
-3-3--------
OOO3--------
3OJ3--9-3--
-----------
3---*(-----
J9---------
OO(*-------
3*-------*--
3-*---*----
.O--3--39-O
.O----3(--.
.3*3---*--.
.H3H-3----.
..3H-3---..
..3-(----..
...3--*-...
....J--....
```

FIG. 12

WAFER MAP CONVERSION METHOD

BACKGROUND OF THE INVENTION

1. Field of the Invention

The present invention relates to a wafer map conversion method, and more particularly to a wafer map conversion method for converting a format file, which is made in accordance with a certain format to include data about a wafer obtained through a wafer testing device and all information associated with the wafer, into a configuration file or standard file which can apply the information about the wafer processing condition and category grades of dies of the wafer to a die bonding process for the dies by lots.

2. Description of the Prior Art

In the fabrication of semiconductor packages, a die bonding process is generally used to bond a die to the pad of a leadframe. In the die bonding process, dies are selectively picked up from those of wafers respectively probe-tested in their manufacturing factories using various testing equipment. The picked-up dies are then bonded to pads of leadframes coated with an adhesive such as epoxy resin, respectively.

Conventionally, dies of probe-tested wafers are dotted with a single kind of ink or two or three kinds of ink to indicate the result of the probe test in their manufacturing factories. These wafers are transported to a semiconductor package fabricating factory and then processed by a sawing process so that they may be divided into individual dies. For the dies, a die bonding process is then carried out.

However, such a conventional method, which involves dotting ink on individual dies to indicate their quality based on the result of the probe test performed for those dies using expensive testing equipment, does not meet with the current requirement associated with die bonding to obtain high-quality products in a limited amount. This is because the dies are sorted only into two extreme grade levels, namely, good and reject-grade levels. Furthermore, the conventional method is expensive due to an increase in cost resulting from the use of the ink dotting process. In addition, contamination adversely affecting chips may occur due to the use of ink.

Since wafers are high-grade products with a highly integrated structure, their chip cost is high. For this reason, it is desirable to use reject-grade wafers for appropriate purposes if their defect or degradation is minor. In this case, it is required to sort dies into more detailed grade levels. Where the sorting of dies based on the ink dotting is used in this case, however, the probe test should be performed several times for every wafer. It is also required to sort dies in accordance with various colors dotted on the dies using at least two or three kinds of ink resulting in an increase in cost. Furthermore, this method is problematic in that a difficulty in the die bonding process occurs where a die bonder provided with a chip pattern recognizing system having no color recognizing ability is used.

Instead of the above-mentioned method involving the ink marking based on the result of the probe test carried out at the final stage of the fabrication of wafers, most semiconductor manufacturers have recently use a method wherein binning coded equivalence (BCE) data are made about category grades of dies indicative of different characteristics of dies based on the result of the probe test for the dies, and then mapped into a wafer map in accordance with a certain mapping format. In accordance with this method, wafers are sent by lots to a semiconductor package fabricating factory along with their wafer map data so that they may be processed by a die bonding process for each grade level of their good/reject-grade dies.

In accordance with the dies processing based on the wafer map, it is possible to perform the processing of good-grade dies for each grade level, based on BCE data. This processing can also be achieved in accordance with a given map format without performing tests for wafer memories and individual dies required to determine processing conditions. It is also possible only to process selected dies without performing the alignment and test for every die. Accordingly, a great improvement in processing quality is expected. This method also achieves an improvement in yield and processing rate (units per hour (UPH)). The efficiency of the equipment used for the die bonding process is also enhanced. In addition, it is unnecessary to perform the ink dotting process after the probe test. As a result, the manufacturing cost is greatly reduced.

However, there is no device capable of performing a die bonding process using the above-mentioned wafer map. Known conventional devices can achieve only sorting good-grade dies using wafer map data.

In other words, it is impossible to change operation modes of all equipment for performing the die bonding process because known die bonders are constructed to perform a die bonding process in accordance with a general vision. For this reason, wafer re-sorting devices have been used only to resort good-grade dies between wafers directly or via a waffle pack so that known die bonders can perform a die bonding process for each grade level of dies based on a wafer map.

However, such wafer re-sorting devices can not directly perform a die bonding process based on a wafer map. Since die-resorted wafers or waffle packs have only good-grade dies, die bonders can not set their processing conditions to process reject-grade dies. Expensive films are consumed upon re-sorting dies between wafers. In this case, a larger number of frames are also required. Furthermore, dies are subject to high stress because they repeat their attachment and detachment two times without being directly attached to leadframes immediately after being picked up. It is also difficult to accurately place dies due to various factors associated with the die bonding process. In addition, dies may rotate or may be broken or damaged. As a result, the rate of poor-quality products increases. There is also an adverse affect on the yield and quality.

SUMMARY OF THE INVENTION

Therefore, an object of the invention is to solve the above-mentioned problems involved in the prior art and to provide a wafer map conversion method capable of achieving a die bonding process based on a wafer map using any conventional die bonders in accordance with a vision.

In accordance with the present invention, this object is accomplished by providing a wafer map conversion method comprising the steps of: probe-testing a wafer, thereby preparing a wafer map format file including a header portion recorded with basic information about the wafer and a data portion recorded with category grades of dies of the wafer; translating the wafer map format file using a wafer map converter, thereby preparing a converting file including a variety of information about the wafer recorded by items and category grades and actual positions of the dies recorded in accordance with the type of the wafer; and forming, using the converting file, a processing mode which displays category grades and actual positions of the dies, and information about the wafer and dies.

BRIEF DESCRIPTION OF THE DRAWINGS

Other objects and aspects of the invention will become apparent from the following description of embodiments with reference to the accompanying drawings in which:

FIG. 1 is a diagram illustrating a row type format file;

FIG. 3 is a diagram illustrating a configuration file converted from the row type format file;

FIG. 4 is a diagram illustrating an array type format file;

FIG. 6 is a diagram illustrating a configuration file converted from the array type format file;

FIG. 7 is a diagram illustrating a Cartesian type format file;

FIG. 9 is a diagram illustrating a configuration file converted from the Cartesian type format file;

FIG. 10 is a diagram illustrating a standard file converted from the row type format file;

FIG. 11 is a diagram illustrating a standard file converted from the array type format file; and FIG. 12 is a diagram illustrating a standard file converted from the Cartesian type format file.

DETAILED DESCRIPTION OF THE PREFERRED EMBODIMENTS

Figure 2:
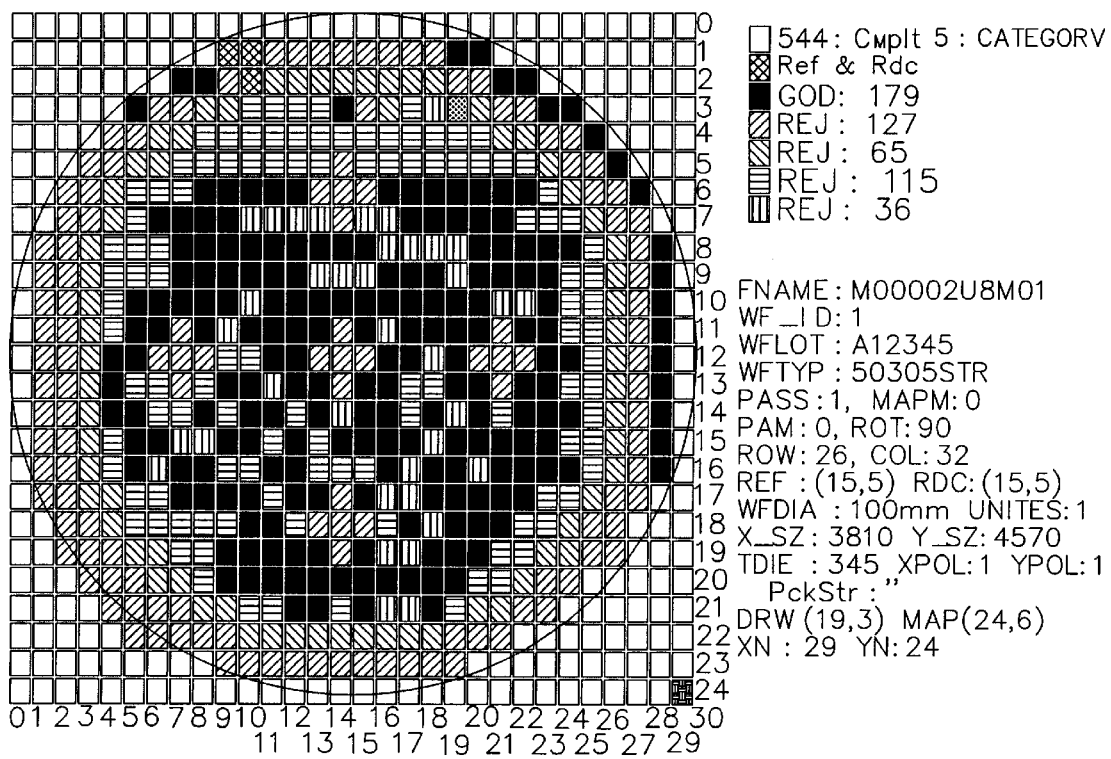
FIG. 2 is a diagram illustrating a processing mode obtained by translating the row type format file.

The term "wafer mapping" used in the present invention means a technique for producing a file including data about category grades of dies of a wafer obtained from wafer testing equipment along with all information associated with the wafer in accordance with a desired mapping format so that dies of wafers can be processed by wafer lots in accordance with data about wafer processing conditions in files for those wafers and each grade level thereof.

In accordance with the present invention, a wafer map format file recorded with various information after probe-testing wafer is translated into a converting file, which is recorded with various information about the wafer by items and with grade levels and positions of the dies respectively corresponding to those in an actual wafer form, in order to take data recorded in the header portion of the wafer map format file along with data about dies recorded in the data portion of the wafer map format file in accordance with each grade level of the dies, thereby processing the dies based on the taken data. Based on the converting file, the present invention provides a practical processing mode which includes two recording areas; one being recorded with grade levels and actual positions of dies while the other being recorded with information about the dies and wafer so that any one can easily identify the condition of the wafer, thereby achieving an easy die bonding process.

As such a converting file, a configuration file or standard file may be selected. The configuration file is formed by directly translating items of a wafer map format file, which may have various formats, without any processing for those items. On the other hand, the standard file is formed by translating items of the wafer map format file after standardizing those items in accordance with a desired format.

In accordance with the present invention, the map file having a certain format is processed so that it can be applied to a die bonding process. To this end, the method of the present invention executes the following functions.

First, the method accurately depicts the shape of the wafer by category grades of dies of the wafer based on data associated with the map file, applies all information associated with the wafer to the die bonding process, and informs the user of these information.

Second, the method executes the checking and editing function, the function of rotating the wafer map and the function of actually rotating the wafer with reference to selected positions on a wafer map operating monitor and a vision monitor needed upon performing the die bonding process, the function of selecting the kind of dies to be processed, the simulation for picking up the selected dies and the function of checking the current processing condition in the middle of the die bonding process.

Third, the method executes the functions of selecting and reading a desired map file, synchronizing required motions between the vision monitor and console monitor on a XY table, searching a reference die on the vision memory, and rotating the wafer or wafer map in order to take a desired wafer or die size which will be sent to the vision memory, thereby finding and aligning dies to be picked up.

On the other hand, known wafer testing devices produce different format files in accordance with different features thereof, respectively. These format files include row type, array type and Cartesian type format files.

A row type format according to the present invention takes the file name, the wafer identifier, the wafer lot, the wafer type, the number of rows, the number of columns, and wafer and die sizes from the header portion of a format file as shown in FIG. 1 and takes BCE data of dies by grade levels from the data portion of the format file in the form of a row format (X, Y, Number of Die, and Mode), thereby producing a processing mode as shown in FIG. 2.

The row type processing mode includes an area recorded with grade levels of dies enabling any one to easily identify category grades of dies and an area recorded with wafer information enabling any one to easily recognize information about the wafer.

That is, the row type processing mode depicts, at its one side area, dies of the wafer while indicating category grades of dies using various symbols (space, @, ! and "). At the upper portion of the other side area, the row type processing mode sequentially indicates the number of complete usable dies (Cmplt;554), the number of category grades (CATEGORY;5), positions of reference and test dies (Ref & Rdc), the number of good-grade dies (GOD;179), the number of primary reject-grade dies (REJ;127), the number of secondary reject-grade dies (REJ;65), the number of third reject-grade dies (REJ;115), and the number of fourth reject-grade dies (REJ;36). The lower portion of the other side area, the row type processing mode also sequentially indicates the file name (FNAME;MOOOO2UBM01), the wafer identifier (WF_ID;1), the wafer lot (WFLOT;A12345), the wafer type (WFTYP;50305STR), the pass (PASS;1) and map mode (MAPM;0), the parameter mode (PAM;0) and rotation (ROT;90), the number of rows (ROW;26) and number of columns (COL;32), the position of the reference die (REF;15,5) and position of the test die (RDC;15,5), the wafer diameter (WFDIA;100 mm) and units (UNITS;1), the X-size (X_SZ;3810) and Y-size (Y_SZ;4750), the number of dies to be processed (TDIE;345), X-pole (XPOL;1), and Y-pole (YPOL;1), pick-up strings (PckStr; space, "), the position on the drawing (DRW;19,3) and position on the map (MAP;24,6), and the number of X's (XN;24,6) and number of Y's (YN;24).

In accordance with the present invention, each wafer map file is translated into a configuration file so that the user can recognize the file. Each configuration file is stored in a desired directory.

Information on the header portion of the format file is translated to record, in the configuration file, the file name (FNAME), the wafer identifier (WF_ID), the wafer lot (WFLOT), the wafer type (WFTYP), the pass (PASS) and map mode (MAPM), the parameter mode (PAM) and rotation (ROT), the number of rows (ROW) and number of columns (COL), the reference die (REF) and test die (RDC), the diameter of the wafer (WFDIA) and units (UNITS), the X-size (X_SZ) and Y-size (Y_SZ), the number of dies to be processed (TDIE;345), and the X-pole (XPOL;1) and Y-pole (YPOL;1). The data portion of the format file is also translated to record positions and category grades of dies in the configuration file.

In the row type format, "X" means the column from which the die bonding process starts whereas "Y" means the row from which the die bonding process starts. "Mode" means the row direction (1) or column direction (0). On the other hand, "NmbOfDie" means the total number of dies in a given mode.

Figure 5:
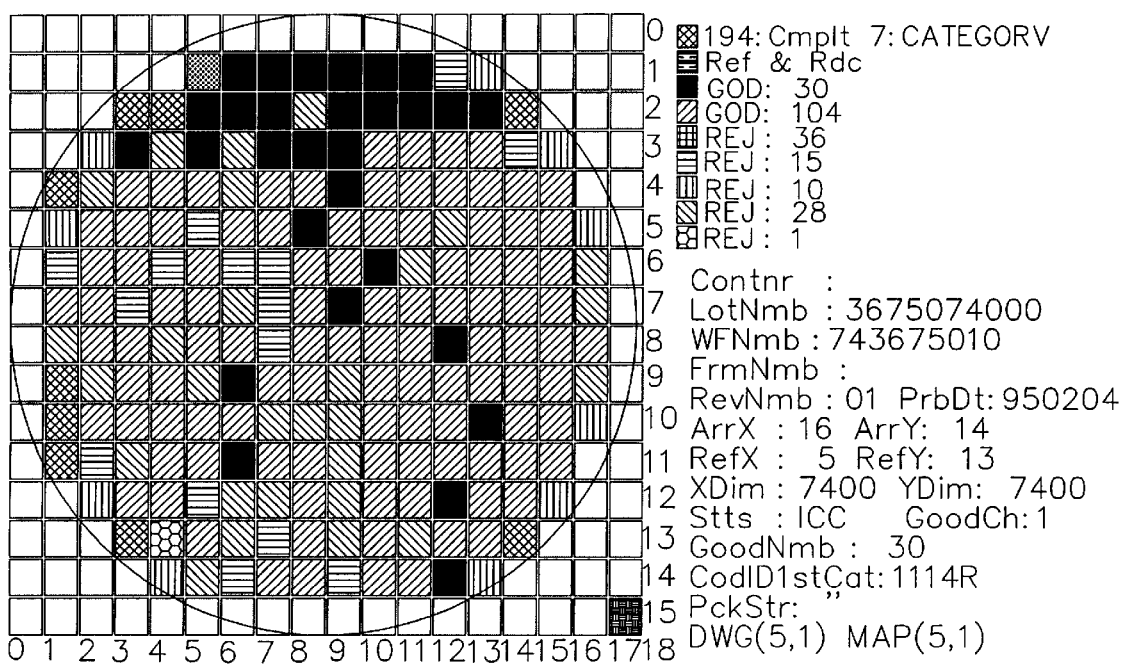
FIG. 5 is a diagram illustrating a processing mode obtained by translating the array type format file.

A array type format according to the present invention takes the lot number (LotNmb), the wafer number (WfNmb), the frame number (FrmNmb), the revision (RevNmb), the date of probing (PrbDate), numbers of array X's and Y's (ArrX&Y) and the die size (DieSize) and takes BCE data of dies by grade levels from the data portion of the map file in the form of an array (X,Y), thereby producing a processing mode as shown in FIG. 5.

Similarly to the row type processing mode, the array type processing mode includes an area recorded with grade levels of dies enabling any one to easily identify category grades of dies and an area recorded with wafer information enabling any one to easily recognize information about the wafer.

That is, the array type processing mode depicts, at its one side area, dies of the wafer while indicating category grades of dies using various numerics and characters (.,1,2,A,B,C, u). At the upper portion of the other side area, the array type processing mode sequentially indicates the number of complete usable dies (Cmplt;194), the number of category grades (CATEGORY;7), positions of reference and test dies (Ref & Rdc), the number of primary good-grade dies (GOD;30), the number of secondary good-grade dies (GOD;104), the number of primary reject-grade dies (REJ;36), the number of secondary reject-grade dies (REJ;15), the number of third reject-grade dies (REJ;10), the number of fourth reject-grade dies (REJ;28), and the number of fifth reject-grade dies (REJ;1). The lower portion of the other side area, the array type processing mode also sequentially indicates the container lot number (LotNmb;3675074000), the wafer number (WFNmb;74367510), the frame number (FrmNmb; the revision number (RevNmb;01), the date of probing (PrbDt;950204), the number of X-dies (ArrX;16) and number of Y-dies (ArrY;14), the X-reference (RefX;5) and Y-reference (RefY;13), the X-size (XDim;7400) and Y-size (YDim;7400), the status (Stts;ICC), the primary good-grade dies (GoodCh;1), the number of primary good-grade dies (GoodNmb;30), the code identifier of the first category (CodId1stCat;114R), the pick-up strings (PckStr), and the position on the drawing (DRW;5,1) and position on the map (MAP;5,1).

In accordance with the present invention, the array type format file is translated into a configuration file as shown in FIG. 6 so that the user can easily recognize the condition of the wafer in a subsequent process.

Information on the header portion of the format file is translated to record, in the array type configuration file, the map revision number (Wf Map Revision Numb), the container, the lot number, the wafer number, the frame number (Magnet or Frame Numb), the date of probing, the X-size (Size Of X Dim Of Map), the Y-size (Size Of Y Dim Of Map), the number of X-dies (X Cordin Of Alignmen), the number of Y-dies (Y Cordin Of Alignmen), the X-size (Step&Repeat Of X Dim), the Y-size (Step&Repeat Of Y Dim), the status, the ASCII value of the first category (ASCIIChar 1st Categ), the number of first category dies (Numb1stCat(GoodNumb)), and characters, counts and codes of the second to fifth categories (Char, Count&Code#2#5). The data portion of the array type format file is also translated to record positions and category grades of dies in the configuration file.

The array type format takes complete dies corresponding in number to a given ArrX&Y.

Figure 8:
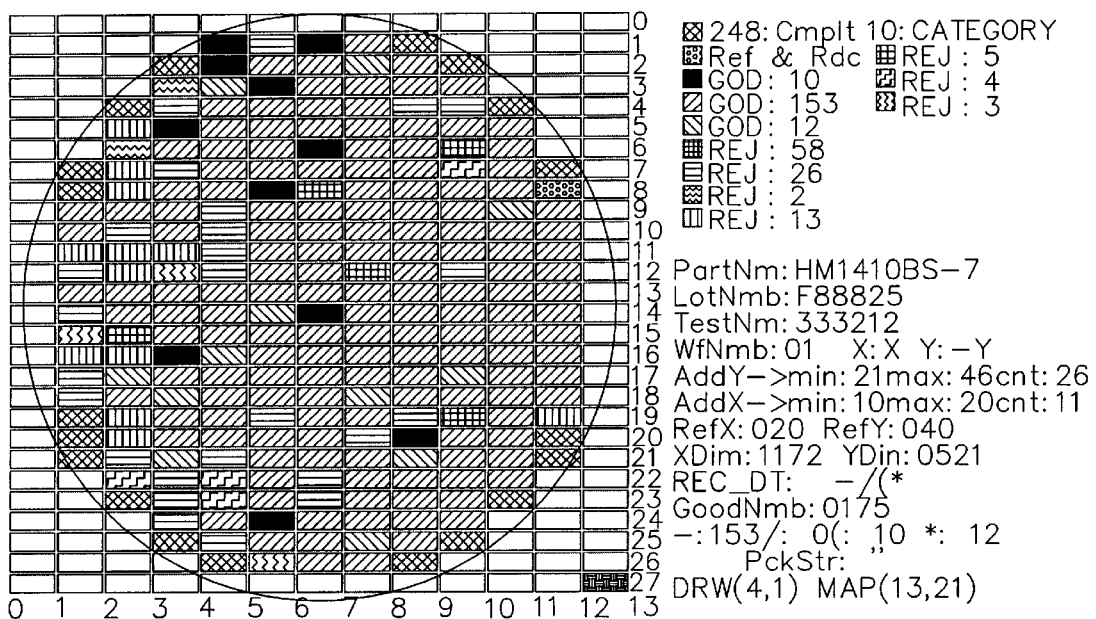
FIG. 8 is a diagram illustrating a processing mode obtained by translating the Cartesian type format file.

On the other hand, a Cartesian type format according to the present invention takes the part number (PartNumb), the lot number (LotNmb), the test number (TestNmb), the wafer number (WfNmb), the map angle (MapAngle), the reference die (RefDiePos), the die size (DieSize), the BCE data (BCE DATA), the number of good-grade dies (GoodDie), and the value of each BCE code from the header portion of a format file as shown in FIG. 7 and takes addresses and category grades corresponding to those address from the data portion of the format file, thereby producing a processing mode as shown in FIG. 8.

The Cartesian type processing mode depicts, at its one side area, dies of the wafer while indicating category grades of dies using various numerics, characters and symbols (space,-,/,(,*,0,3,9,H,J). At the upper portion of the other side area, the row type processing mode sequentially indicates the number of complete usable dies (Cmplt;248), the number of category grades (CATEGORY;10), positions of reference and test dies (Ref & Rdc), the number of primary good-grade dies (GOD;10), the number of secondary good-grade dies (GOD;153), the number of third good-grade dies (GOD;12), the number of primary reject-grade dies (REJ;58), the number of secondary reject-grade dies (REJ;153), the number of third reject-grade dies (REJ;2), and the number of fourth reject-grade dies (REJ;13), the number of fifth reject-grade dies (REJ;5), the number of six reject-grade dies (REJ;4), and the number of seventh reject-grade dies (REJ;8). The lower portion of the other side area, the Cartesian type processing mode also sequentially indicates the part number (PartNm;HM1410BS-7), the lot number (LotNum;F88825), the test number (TestNm;333212), the wafer number (WfNmb;01), X and Y directions (X:X Y:-Y), the Y-address (AddY→min:21max: 46cnt:26), the X-address (AddX→min:10max:20cnt:11), the X-reference (RefX;020) and Y-reference (RefY;040), the X-size (XDim;172) and Y-size (YDim;0521), the kind of good-grade dies (BCE_DT; -/(*)), the number of good-grade dies (GoodNumb;0175), numbers of different good-grade dies (-;153 /;0 (;10 *;12)), pick-up strings (PckStr; space, "), and the position on the drawing (DRW;4,1) and position on the map (MAP;13,21).

In accordance with the present invention, the Cartesian format file is translated into a configuration file as shown in FIG. 9 so that the user can easily recognize the file.

Information on the header portion of the format file is translated to record, in the configuration file, the part number (PartNm), the lot number (LotNmb), the test number (TestNm), the wafer number (WfNmb), the X and Y-directions (X,Y), the Y-address (AddY), the X-address (AddX), the X-reference (RefX) and Y-reference (RefY), the X-size (XDim) and Y-size (YDim), the kind of good-grade dies (BCE_DT), the total number of good-grade dies (GoodNmb), and numbers of difference good-grade dies. The data portion of the format file is also translated to record positions and category grades of dies in the configuration file.

Meanwhile, a wafer map converter is used in accordance with the present invention. The wafer map converter serves to convert a map file, which may have various types as mentioned above, into a standard file so that the file may be applied to die bonding devices of any types. This wafer map converter forms a processing mode translated from the map file and automatically forms a configuration file or standard file for catalogs.

That is, the wafer map converter executes the following functions:

1) to select an intrinsic map file for each wafer and to generate a map operating mode;

2) to operate the following desired functions in the map operating mode in accordance with an intrinsic format associated with the map operating mode,
   the function to check and rearrange dies while moving those dies,
   the function to select dies to be processed for one grade level,
   the function to select dies to be processed for various grade levels,
   the function to rotate the wafer map by the unit of 90°,
   the function to determine an actual direction of the wafer in accordance with the operating angle of the wafer map,
   the function to shut down the die bonding device in the middle of the die bonding process and to rearrange dies upon carrying out the die bonding process again; and 3) to automatically produce the standard map file (or configuration file), to execute the standard map operating mode, and to operate operating functions which are identical to those mentioned in association with the item 2.

The wafer map converter also serves to increase or decrease numbers of dies in row and column directions for obtaining an optimum processing condition with reference to the given map file and to apply an associated reference die.

On the other hand, the standard file produced by the wafer map converter records data obtained by translating the format file irrespective of the type of the format file. That is, information on the header portion of the format file is translated to record, in the standard file, the map revision number (MpRvNmb), the customer number (CustmNm), the wafer identifier (WfId), the lot identifier (LtId), the frame identifier (FrId), the date of probing (PrbDt), the X-size (ArrXSz), the Y-size (ArrYSz), the X-die size (DieXsz), the Y-die size (DieYsz), the wafer size (WfSize), the map angle (MpAngl), the X-reference (RfXCdn), the Y-reference (Y-reference (RfYCdn), the number of categories (CtgCnt), types of all categories (Ctgry), the category indicating good-grade dies (BCE_DT), the first status (Stts1) and the second status (Stts2). The data portion of the format file is also translated to record positions and category grades of dies in the configuration file.

As apparent from the above description, the present invention provides a wafer map conversion method capable of converting a format file, which includes data about a wafer obtained by category grades through a wafer testing device and all information associated with the wafer in accordance with a certain format, into a configuration file or standard file which can be practically applied to a die bonding device, thereby easily checking the content of the process through a processing mode translated from the configuration file or standard file. Practically, the die bonding process for good-grade dies by grade levels can be achieved based on BCE data. It is also possible to perform the die bonding process in accordance with a certain map format without requiring any test for the wafer memory and dies. Only selected dies can be processed without requiring an alignment and test for every die. Accordingly, a great improvement in the process quality is obtained. An improvement in yield in processing rate (UPH) is also achieved. The efficiency of the equipment used for the die bonding process is also enhanced. In addition, it is unnecessary to perform the ink dotting process after the probe test. As a result, the manufacturing cost is greatly reduced.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A wafer map conversion method comprising:

preparing a wafer map format file including a header portion recorded with basic information about a wafer and a data portion recorded with category grades of dies of the wafer;

converting the wafer map format file to create a converted file by translating the wafer map format file, the converted file including a variety of information about the wafer recorded by items and category grades and actual positions of the dies recorded in accordance with the type of the wafer; and forming, using the converted file, a processing mode which displays category grades and actual positions of the dies, and information about the wafer and dies.

2. The wafer map conversion method in accordance with claim 1, wherein the converted file is a configuration file which is formed by directly translating items of the wafer map format file, which have various formats, without any processing for those items.

3. The wafer map conversion method in accordance with claim 1, wherein the converted file is a standard file which is formed by translating items of the wafer map format file after standardizing the items in accordance with a desired format.

4. The wafer map conversion method in accordance with claim 1, wherein converting includes editing a die for a wafer mapping process.

5. The wafer map conversion method in accordance with claim 1, wherein converting includes selecting one or more dies to be processed.

6. The wafer map conversion method in accordance with claim 1, wherein converting includes rotating map data by a desired angle.

7. The wafer map conversion method in accordance with claim 1, wherein converting includes determining an actual direction of the wafer based on map data in accordance with a processing condition.

8. The wafer map conversion method in accordance with claim 1, further comprising editing using a wafer map converter.

9. The wafer map conversion method in accordance with claim 2, wherein the configuration file is a row type configuration file.

10. The wafer map conversion method in accordance with claim 2, wherein the configuration file is an array type configuration file.

11. The wafer map conversion method in accordance with claim 2, wherein the configuration file is a Cartesian type configuration file.

12. The wafer map conversion method in accordance with claim 5, further comprising bonding one or more dies after selecting one or more dies to be processed.

13. The wafer map conversion method in accordance with claim 1, wherein forming a processing mode further comprises forming first and second areas, said first area including information representing grade levels and actual positions of the dies, and said second area including information about the dies and the wafer.

* * * * *